(12) United States Patent
Wakisaka

(10) Patent No.: US 9,343,428 B2
(45) Date of Patent: *May 17, 2016

(54) SEMICONDUCTOR DEVICE INCLUDING SEMICONDUCTOR CONSTRUCT INSTALLED ON BASE PLATE, AND MANUFACTURING METHOD OF THE SAME

(71) Applicant: TERA PROBE, INC., Yokohama, Kanagawa (JP)

(72) Inventor: Shinji Wakisaka, Hanno (JP)

(73) Assignee: TERA PROBE, INC., Yokohama, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/791,068

(22) Filed: Jul. 2, 2015

(65) Prior Publication Data

US 2015/0311181 A1 Oct. 29, 2015

Related U.S. Application Data

(60) Continuation of application No. 14/299,775, filed on Jun. 9, 2014, now Pat. No. 9,105,580, which is a division of application No. 12/944,114, filed on Nov. 11, 2010, now abandoned.

(30) Foreign Application Priority Data

Nov. 13, 2009 (JP) ................................. 2009-259874

(51) Int. Cl.
*H01L 21/56* (2006.01)
*H01L 23/00* (2006.01)
(Continued)

(52) U.S. Cl.
CPC ............ *H01L 24/97* (2013.01); *H01L 21/4889* (2013.01); *H01L 21/561* (2013.01);
(Continued)

(58) Field of Classification Search
CPC ...................................................... H01L 24/87
USPC ......................................................... 438/113
See application file for complete search history.

(56) References Cited

U.S. PATENT DOCUMENTS 9,105,580 B2 * 8/2015 Wakisaka .............. H01L 21/561
2003/0219956 A1 11/2003 Mori et al.
(Continued)

FOREIGN PATENT DOCUMENTS

CN 1574263 A 2/2005
CN 101202254 A 6/2008
(Continued)

OTHER PUBLICATIONS

Chinese Office Action dated Oct. 30, 2012 in counterpart Chinese Application No. 201010610892.9.
(Continued)

*Primary Examiner* — Edward Wojciechowicz
(74) *Attorney, Agent, or Firm* — Holtz, Holtz & Volek PC

(57) ABSTRACT

A semiconductor device includes a semiconductor construct including a semiconductor substrate and an external connection electrode provided to protrude on a surface of the semiconductor substrate, a base plate on which the semiconductor construct is installed, and a sealing layer stacked on the semiconductor substrate except for the external connection electrode and on the base plate including a side surface of the semiconductor substrate.

20 Claims, 7 Drawing Sheets

(51) Int. Cl.
*H01L 23/31* (2006.01)
*H01L 23/498* (2006.01)
*H01L 23/538* (2006.01)
*H01L 21/48* (2006.01)
*H01L 21/78* (2006.01)
*H01L 23/492* (2006.01)

(52) U.S. Cl.
CPC ........... *H01L 21/78* (2013.01); *H01L 23/3128* (2013.01); *H01L 23/3171* (2013.01); *H01L 23/492* (2013.01); *H01L 23/49816* (2013.01); *H01L 23/5389* (2013.01); *H01L 24/11* (2013.01); *H01L 24/14* (2013.01); *H01L 24/19* (2013.01); *H01L 24/20* (2013.01); *H01L 24/29* (2013.01); *H01L 24/83* (2013.01); *H01L 2224/04105* (2013.01); *H01L 2224/11612* (2013.01); *H01L 2224/1301* (2013.01); *H01L 2224/20* (2013.01); *H01L 2224/211* (2013.01); *H01L 2224/32225* (2013.01); *H01L 2224/32245* (2013.01); *H01L 2224/73267* (2013.01); *H01L 2224/92244* (2013.01); *H01L 2224/97* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01078* (2013.01); *H01L 2924/01087* (2013.01); *H01L 2924/12042* (2013.01); *H01L 2924/3025* (2013.01)

(56) References Cited

U.S. PATENT DOCUMENTS

| | | |
|---|---|---|
| 2004/0232543 A1 | 11/2004 | Goller et al. |
| 2006/0022332 A1 | 2/2006 | Koyama et al. |
| 2007/0249093 A1 | 10/2007 | Aiba et al. |
| 2008/0012129 A1 | 1/2008 | Watanabe |
| 2008/0054479 A1 | 3/2008 | Watanabe |
| 2009/0095415 A1 | 4/2009 | Halope et al. |
| 2010/0052142 A1 | 3/2010 | Tojo et al. |

FOREIGN PATENT DOCUMENTS

| | | |
|---|---|---|
| JP | 10200256 A | 7/1998 |
| JP | 2002190672 A | 7/2002 |
| JP | 2005353837 A | 12/2005 |
| JP | 2007287901 A | 11/2007 |
| JP | 200860298 A | 3/2009 |

OTHER PUBLICATIONS

Taiwanese Office Action dated May 23, 2013 in counterpart Taiwanese Application No. 099138903.

Chinese Office Action dated Sep. 23, 2014 in counterpart Chinese Application No. 201010610892.9.

\* cited by examiner

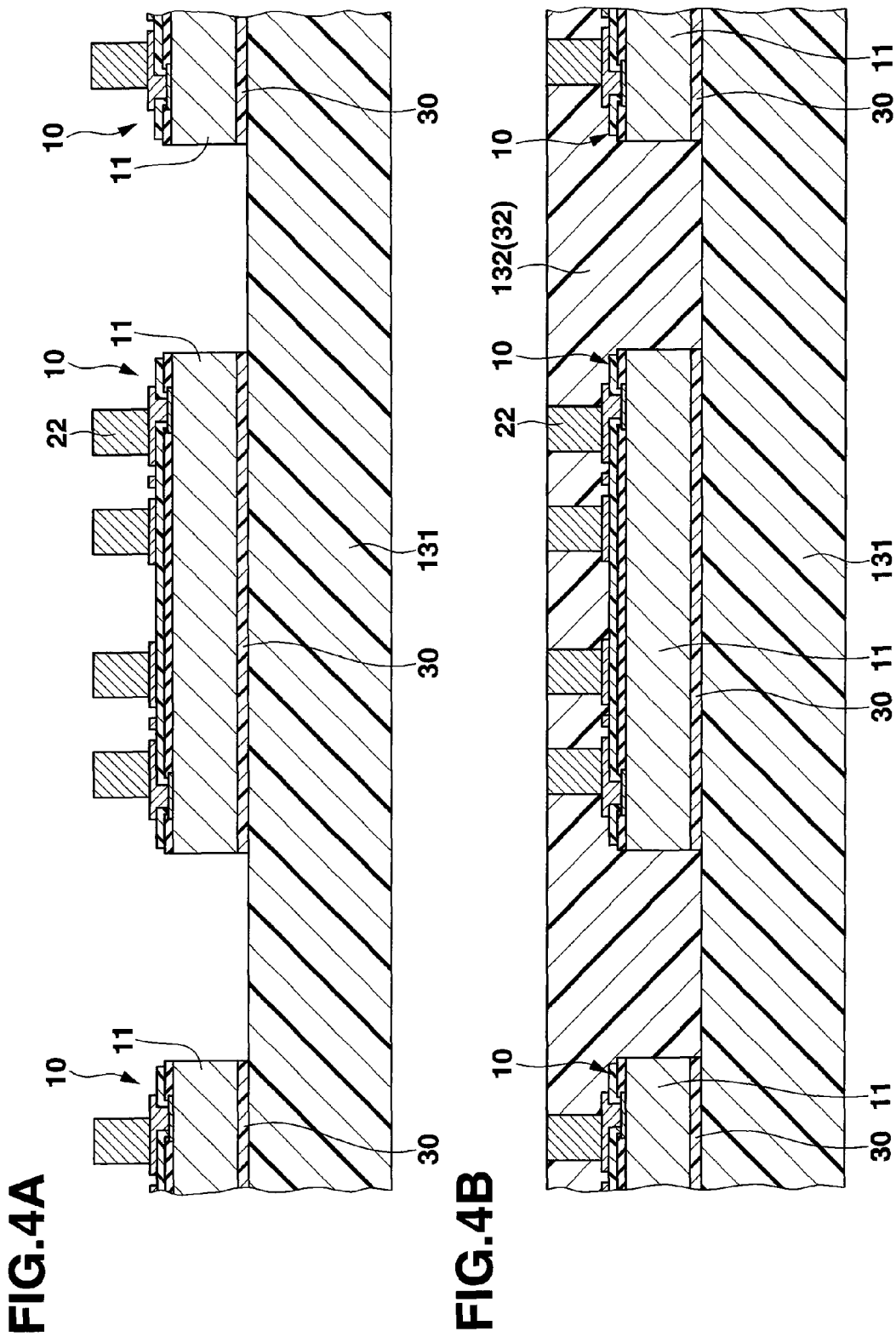

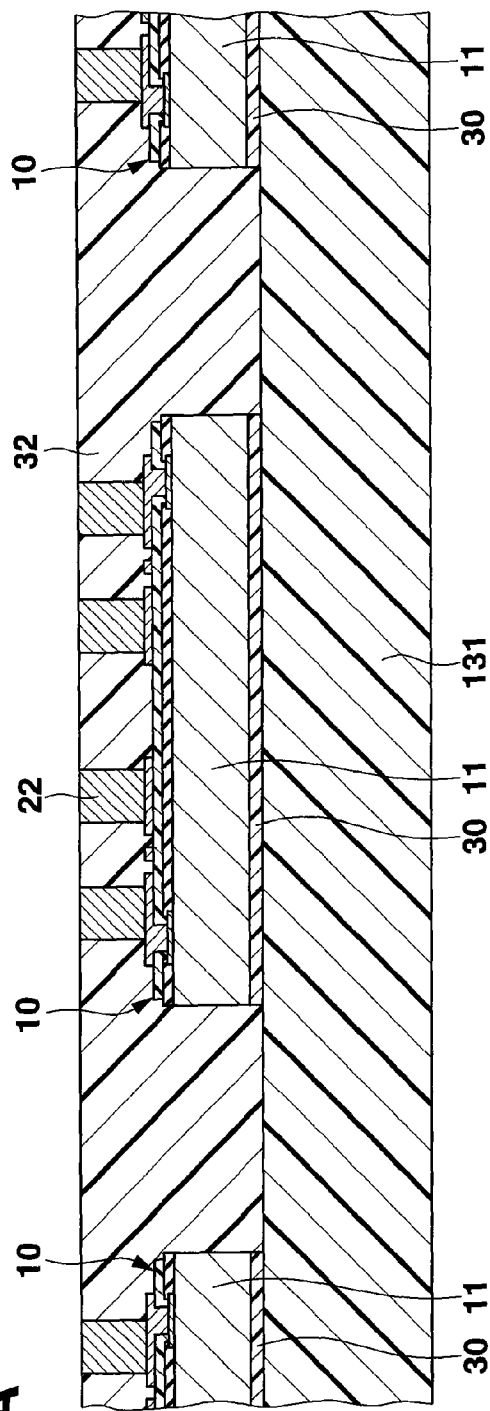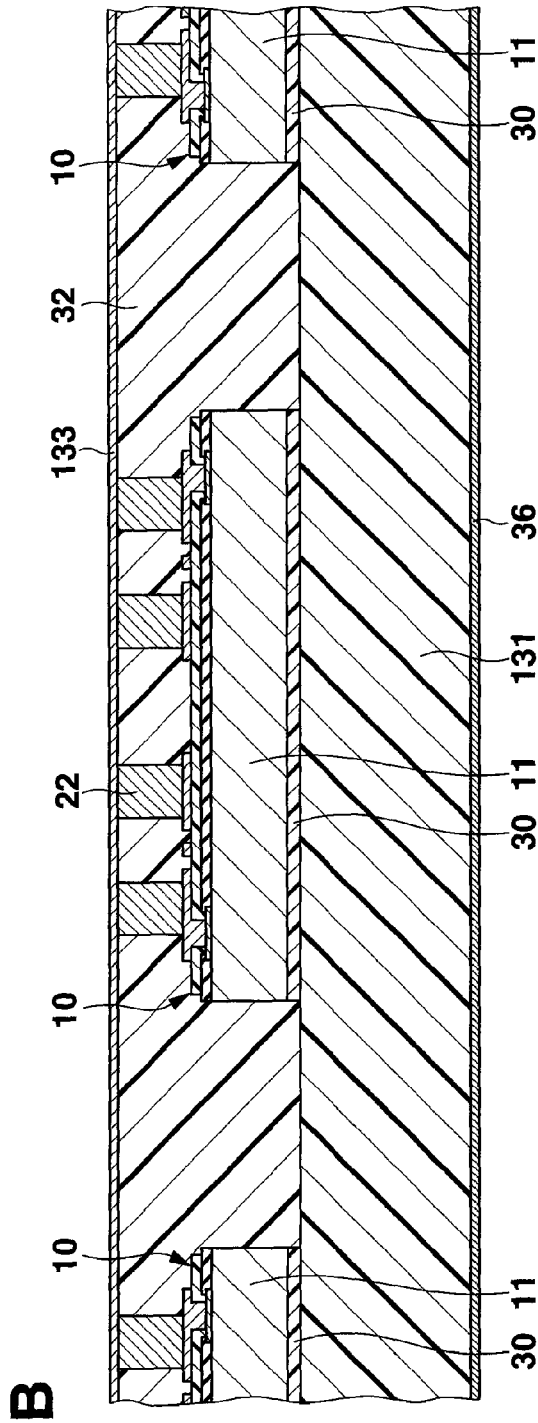

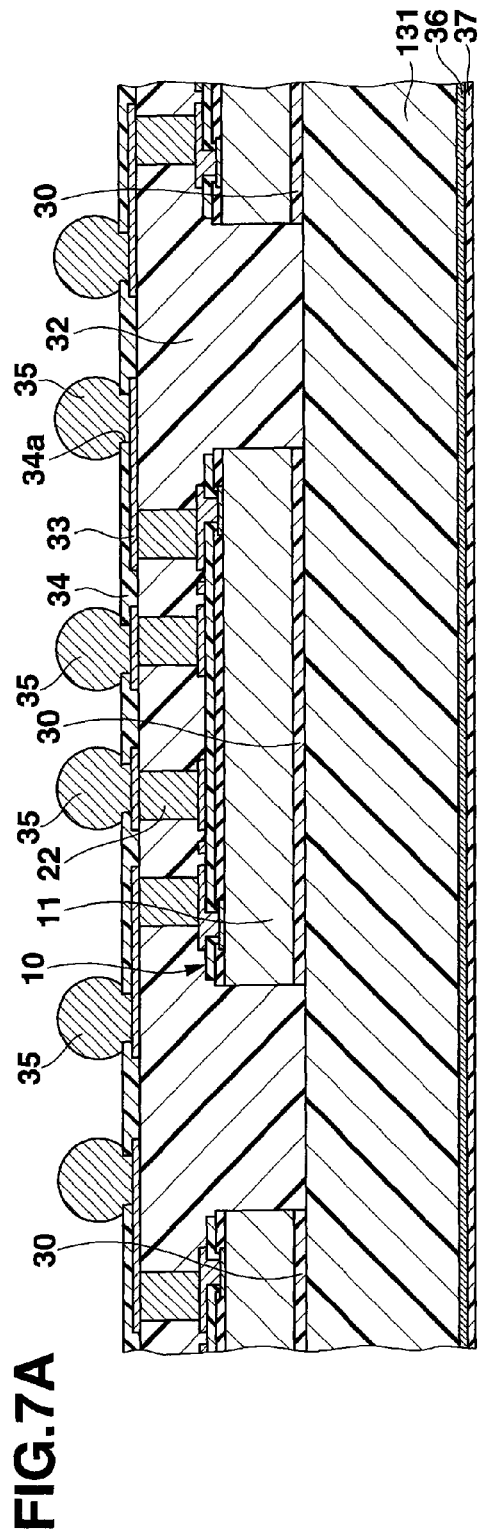
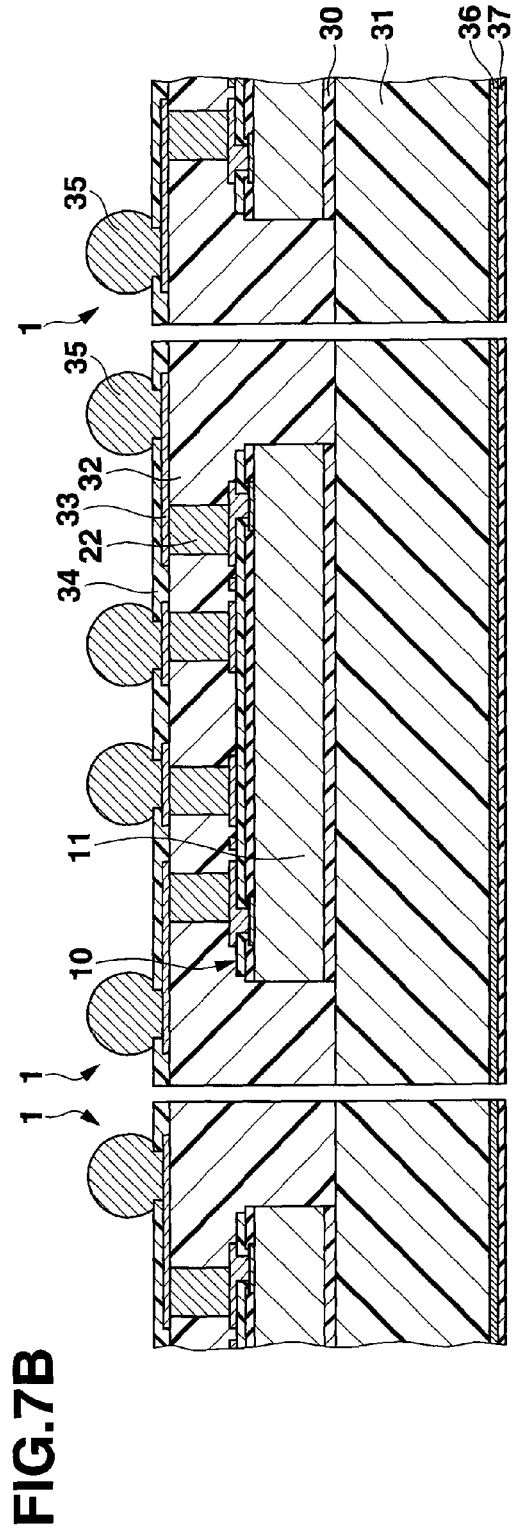
FIG.7A
FIG.7B

SEMICONDUCTOR DEVICE INCLUDING SEMICONDUCTOR CONSTRUCT INSTALLED ON BASE PLATE, AND MANUFACTURING METHOD OF THE SAME

CROSS-REFERENCE TO RELATED APPLICATIONS

This is a Continuation of U.S. application Ser. No. 14/299,775, filed Jun. 9, 2014, which is a Divisional of U.S. application Ser. No. 12/944,114, filed Nov. 11, 2010, now abandoned, which is based upon and claims the benefit of priority from prior Japanese Patent Application No. 2009-259874, filed Nov. 13, 2009, the entire contents of both of which are incorporated herein by reference.

BACKGROUND OF THE INVENTION

1. Field of the Invention

The present invention relates to a semiconductor device and a manufacturing method of the same.

2. Description of the Related Art

Jpn. Pat. Appln. KOKAI Publication No. 2008-60298 has disclosed a so-called water level package (WLP) and embedded water level package (EWLP) as IC chip packaging methods. The WLP method includes sealing a wafer-state semiconductor wafer with a resin, forming a terminal in the semiconductor wafer, and then cutting the semiconductor wafer into a chip size (e.g., see FIG. 2 to FIG. 10 of Patent document 1). As a result, a small package equal in size to the built-in IC chip can be manufactured.

The EWLP method includes further packaging a chip manufactured by the WLP method to embed the chip in a substrate (e.g., see FIG. 11 to FIG. 16 of Patent document 1). More specifically, a plurality of semiconductor chips (2) packaged by the WLP method are arranged on a base plate (1). A lattice-like semi-cured resin sheet (14a) is laid on the base plate (1) around the semiconductor chips (2), and another semi-cured resin sheet (15a) is further laid on the semi-cured resin sheet (14a) and the semiconductor chips (2). These semi-cured resin sheets (14a, 15a) are cured by heating and pressurization. Further, a via (16) is formed by laser in an insulating layer (15) which is formed by the curing of the semi-cured resin sheet (15a). Wiring lines (17, 18) are formed by a semi-additive process. The wiring lines (17, 18) are connected to an electrode (12) of the semiconductor chip (2). A solder (21) is then formed on the wiring lines (17, 18), and the base plate (1), a sealing layer (14) and the insulating layer (15) are diced for each of the semiconductor chips (2).

Meanwhile, the manufacturing method described in Patent document 1 requires a step of forming a via (16) by laser to connect the wiring lines (17, 18) to the electrode (12). To this end, equipment for laser processing is needed. Moreover, the number of manufacturing steps is increased, and the manufacturing costs rise.

It is therefore an object of the present invention is to enable the elimination of the step of forming the via by laser processing and to reduce the manufacturing steps, manufacturing time and manufacturing costs of a semiconductor device.

BRIEF SUMMARY OF THE INVENTION

To achieve to foregoing object, according to one aspect of the present invention, there is provided a semiconductor device comprising: a semiconductor construct including a semiconductor substrate, and a columnar electrode provided to protrude on the surface of the semiconductor substrate; a base plate on which the semiconductor construct is installed; and a sealing layer stacked on the semiconductor substrate except for the columnar electrode and on the base plate including the side surface of the semiconductor substrate.

According to another aspect of the present invention, there is provided a semiconductor device manufacturing method comprising: mounting a plurality of semiconductor constructs on a base plate, each of the semiconductor constructs including a columnar electrode provided to protrude on the surface of a semiconductor substrate; and stacking a sealing layer on the semiconductor substrate except for the columnar electrode and on the base plate including the side surface of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIGS. 4A, and 4B are process charts following steps in FIG. 3;

FIGS. 5A, and 5B are process charts following steps in FIG. 4;

FIGS. 7A, and 7B are process charts following steps in FIG. 6.

DETAILED DESCRIPTION OF THE INVENTION

Figure 1:
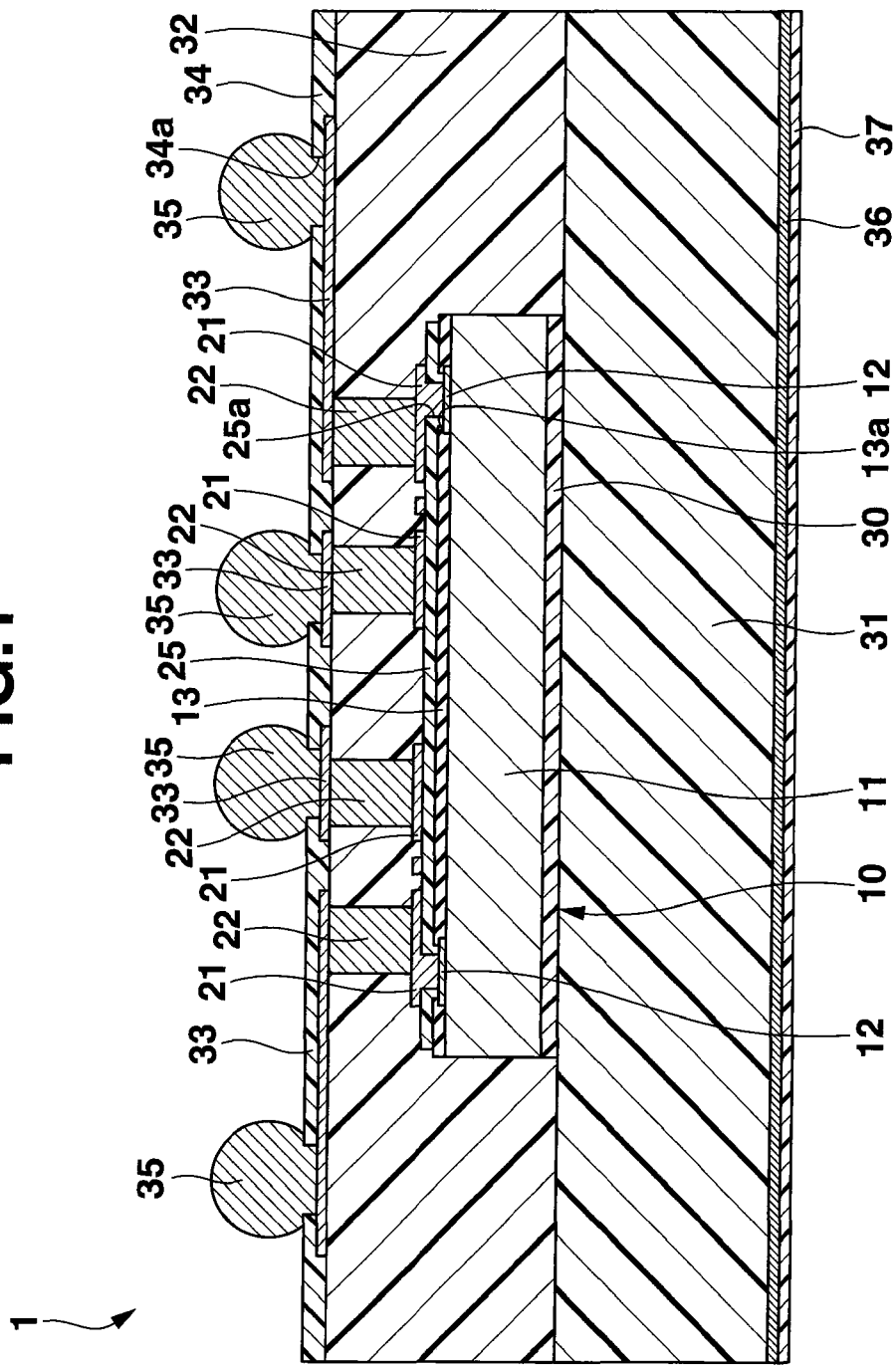
FIG. 1 is a sectional view of a semiconductor device according to an embodiment of the present invention.

An embodiment of the present invention will be described hereinafter with reference to the drawings. Although various restrictions which are technically preferable to carry out the present invention are imposed on the embodiment described below, the scope of the invention is not limited to the following embodiment and examples shown in the drawings.

FIG. 1 is a sectional view of a semiconductor device 1.

This semiconductor device 1 comprises a base plate 31, a semiconductor construct 10, a sealing layer 32, an upper wiring line 33 and a solder ball 35. The semiconductor construct 10 includes a semiconductor chip 11, a passivation film 13, a plurality of connection pads 12, a protective film 25, a rewiring line 21 and a columnar electrode (an external connection electrode) 22. Further, the columnar electrode 22 in the shape of a circular cylinder, a prism or some other column is provided to protrude on the surface of the semiconductor chip 11. The semiconductor chip 11 is bonded onto the base plate 31 by an adhesive layer 30. The sealing layer 32 is stacked on the base plate 31 to cover the semiconductor chip 11. The columnar electrode 22 penetrates the sealing layer 32.

The semiconductor chip 11 is a semiconductor substrate in the form of a piece. The semiconductor chip 11 is made of, for example, silicon. An LSI is formed on the surface of the semiconductor chip 11. The connection pads 12 are formed on the surface of the semiconductor chip 11, and are connected to a wiring line of the LSI. The passivation film 13 covers the LSI. The passivation film 13 is made of, for example, silicon oxide or silicon nitride. The passivation film 13 is provided with an opening 13a that exposes the connection pad 12.

The protective film 25 is stacked on the passivation film 13. The protective film 25 is made of a polyimide resin or some other resin. For the protective film 25, it is possible to use, for example, a high-function plastic material such as polyimide (PI) or polybenzoxazole (PBO), an epoxy, phenol or silicon plastic material, or a composite material of the above materials.

The protective film 25 is provided with an opening 25a that exposes the connection pad 12. The opening 25a of the protective film 25 is smaller than the opening 13a of the passivation film 13. The connection pad 12 and the protective film 25 are in close contact at the outer circumferential portion of the opening 25a.

A foundation metal layer (not shown) is formed on the protective film 25 including the upper surface of the connection pad 12. The foundation metal layer is a copper (Cu) film, or a film in which copper is stacked on titanium (Ti). When viewed in plan, the foundation metal layer is patterned into a predetermined shape. The foundation metal layer is partly stacked on the connection pad 12, and is connected to the connection pad 12 via the openings 13a, 25a. The rewiring line 21 is formed on the foundation metal layer. The rewiring line 21 is a copper (Cu) film. When viewed in plan, the rewiring line 21 is patterned into a predetermined shape. The patterned shapes of the rewiring line 21 and the foundation metal layer are substantially the same. In addition, no protective film 25 may be formed, and the rewiring line 21 may be formed on the passivation film 13.

The columnar electrode 22 is formed on part of the rewiring line 21. The columnar electrode 22 is made of copper or some other metal. Each rewiring line 21 electrically connects the corresponding connection pad 12 and columnar electrode 22.

The semiconductor chip 11 is bonded to the base plate 31 by the adhesive layer 30. The bonding surface of the semiconductor chip 11 is opposite to the surface in which the passivation film 13, the connection pad 12 and the columnar electrode 22 are formed.

The base plate 31 is made of a glass fiber reinforced epoxy resin (including a glass fabric epoxy resin), a carbon fiber reinforced epoxy resin (including a carbon fabric epoxy resin), a glass fiber reinforced polyimide resin (including a glass fabric polyimide resin), a carbon fiber reinforced polyimide resin (including a carbon fabric polyimide resin), or some other fiber reinforced resin.

The sealing layer 32 is stacked on the surface of the semiconductor chip 11 except for the columnar electrode 22 and on the base plate 31 including the side surface of the semiconductor chip 11. Here, the sealing layer 32 is stacked on the base plate 31 around the semiconductor chip 11. The semiconductor chip 11 is covered with the sealing layer 32. Part of the sealing layer 32 is stacked on the semiconductor chip 11. The rewiring line 21 is covered with the sealing layer 32 except for the part where the columnar electrode 22 is formed. The columnar electrode 22 penetrates the sealing layer 32. The surface of the sealing layer 32 is provided to be flush with the surface (top face) of the columnar electrode 22. The surface of the columnar electrode 22 is not covered with the sealing layer 32.

The sealing layer 32 is formed by curing a sheet-like resin (prepreg) in a semi-cured condition (B-stage condition). The sealing layer 32 is made of a fiber reinforced resin or a resin which is not fiber reinforced. More specifically, the sealing layer 32 is made of a glass fiber reinforced epoxy resin (including a glass fabric epoxy resin), a glass fiber reinforced polyimide resin (including a glass fabric polyimide resin), or some other fiber reinforced resin. Alternatively, the sealing layer 32 is made of a substrate material epoxy resin which is not fiber reinforced, a substrate material polyimide resin, or some other substrate material resin. For example, such materials include MEGTRON6 which is a multilayer printed circuit board material having a low dielectric constant and high heat resistance and which is manufactured by Panasonic Electric Works Co., Ltd., and MEGTRON3 which is a semiconductor package substrate material. It is also possible to use an FR-4 multilayer material "MCL" manufactured by Hitachi Chemical Co., Ltd., a highly heat-resistant and highly reliable FR-4 multilayer material "MCL", a halogen-free FR-4 multilayer material "MCL", a high Tg epoxy multilayer material "MCL", a highly elastic and low thermal expansion multilayer material "MCL", a halogen-free highly elastic and low thermal expansion multilayer material "MCL", a halogen-free highly elastic and low thermal expansion multilayer material "MCL" for a thin package, a low dielectric loss tangent and highly heat-resistant multilayer material "MCL", a halogen-free low dielectric loss tangent and highly heat-resistant multilayer material "MCL" having a low dielectric constant, or a halogen-free highly heat-resistant multilayer material "MCL" having a low dielectric constant. The sealing layer 32 has light blocking properties.

The upper wiring line 33 is formed on the sealing layer 32. The upper wiring line 33 is a copper (Cu) film, a titanium (Ti) film, a film in which copper is stacked on titanium, or some other conductive film. When viewed in plan, the upper wiring line 33 is patterned into a predetermined shape. Part of the upper wiring line 33 is stacked on the surface (top face) of the columnar electrode 22, and the upper wiring line 33 is connected to the columnar electrode 22.

An overcoat film 34 is stacked on the sealing layer 32, and the upper wiring line 33 is covered with the overcoat film 34. The overcoat film 34 is made of a resin material. The overcoat film 34 is a solder resist. That is, an opening 34a is formed in the overcoat film 34, and part of the upper wiring line 33 is exposed in the opening 34a, on which the solder ball 35 is formed. The solder ball 35 is coupled to the upper wiring line 33 so that the solder ball 35 and the upper wiring line 33 are electrically connected to each other. In addition, no solder ball 35 may be provided.

A conductive film 36 is stacked on the surface opposite to the surface on which the semiconductor chip 11 is installed. An overcoat layer 37 is stacked on the conductive film 36. The conductive film 36 has the same composition as the upper wiring line 33. The overcoat layer 37 has the same composition as the overcoat film 34.

In FIG. 1, one semiconductor chip 11 is installed on the base plate 31, and this semiconductor chip 11 is embedded in the sealing layer 32. On the contrary, a plurality of semiconductor chips 11 may be installed on the base plate 31, and these semiconductor chips 11 may be embedded in the sealing layer 32.

A method of manufacturing the semiconductor device 1 is described with reference to FIG. 2 to FIG. 7. FIG. 2 to FIG. 7 are diagrams showing the method of manufacturing the semiconductor device 1. The method of manufacturing the semiconductor device 1 is broadly divided into a preprocess shown in FIG. 2 and FIG. 3 and a post-process shown in FIG. 4 to FIG. 7. The preprocess is a process for manufacturing the semiconductor construct 10. The post-process is a process for packaging the manufactured semiconductor construct 10.

First, the process for manufacturing the semiconductor construct 10 which is the preprocess is described.

Figure 2A:
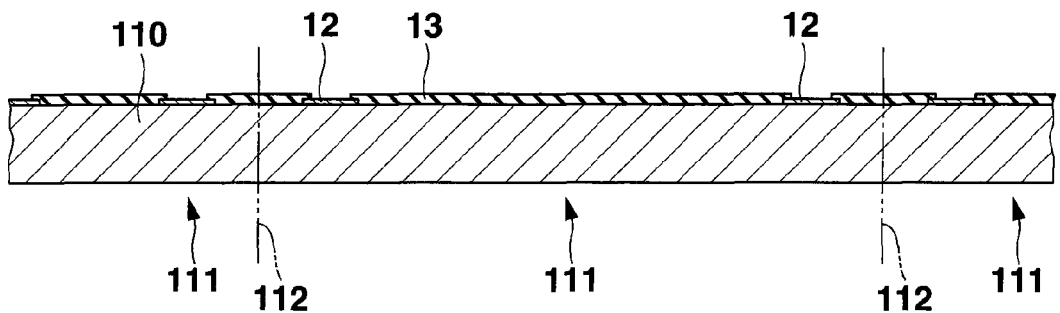
FIGS. 2A, 2B, 2C, and 2D are process charts of a method of manufacturing the semiconductor device shown in FIG. 1.

FIG. 2A is a sectional view of a semiconductor wafer 110 before diced. As shown in FIG. 2A, the semiconductor wafer 110 is a semiconductor substrate which is not divided into pieces. That is, the semiconductor wafer 110 is separated into a plurality of chip regions 111 by lattice-like dicing streets 112 that serve as scheduled dividing lines. These chip regions 111 are arranged in matrix form.

An LSI is formed on the surface of the semiconductor wafer 110 for each of the chip regions 111. A plurality of connection pads 12 are also formed on the surface of the semiconductor wafer 110. A passivation film 13 is formed on the surface of the semiconductor wafer 110, and the LSI is covered with the passivation film 13.

Figure 2B:
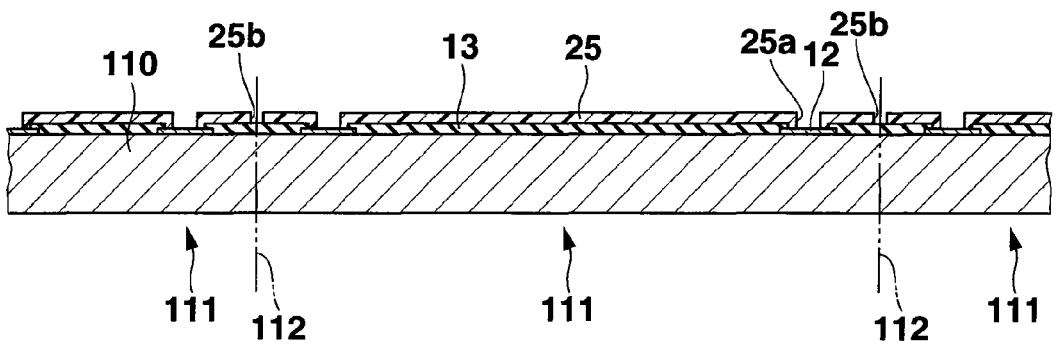

First, as shown in FIG. 2B, an insulating resin film is formed on the surface of the semiconductor wafer 110. This insulating resin film is patterned to form an opening 25a and a trench 25b in this film. The insulating resin film is then divided into protective films 25 for the respective chip regions 111. Here, the trenches 25b are formed into a lattice shape along the dicing streets 112.

A foundation metal layer and a rewiring line 21 are formed. The semi-additive process is used as a method of forming the foundation metal layer and the rewiring line 21.

More specifically, first, the foundation metal layer is formed on the entire upper surface of the protective film 25 including the upper surface of the connection pad 12 exposed through the openings 13a, 25a of the passivation film 13 and the protective film 25. In this case, the foundation metal layer may only be a copper layer formed by electroless plating, may only be a copper layer formed by sputtering, or may be a copper layer formed by sputtering on a thin layer of, for example, titanium formed by sputtering.

Then, a plating resist film is patterned/formed on the upper surface of the foundation metal layer. In this case, an opening is formed in a part of the plating resist film corresponding to a region where the rewiring line 21 is to be formed.

Figure 2C:
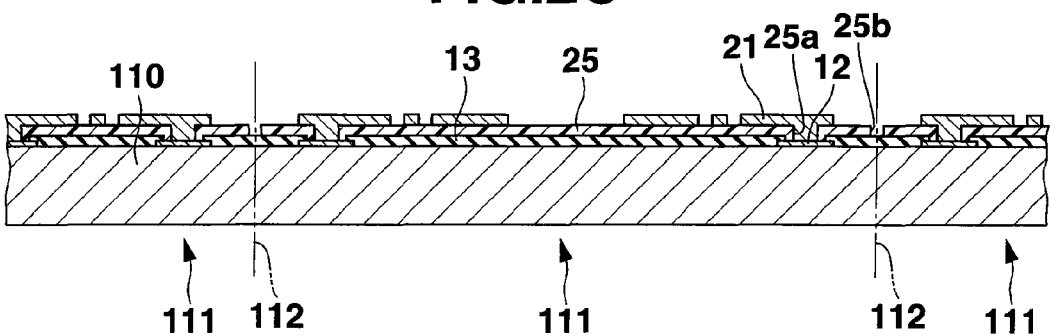

Then, as shown in FIG. 2C, the rewiring line 21 is formed on the foundation metal layer. More specifically, electrolytic plating with copper is carried out using the foundation metal layer as a plating current path, thereby forming the rewiring line 21 on the upper surface of the foundation metal layer within the opening of the plating resist film.

Then, the plating resist film is released. At this moment, the foundation metal layer has not been patterned yet.

Figure 2D:
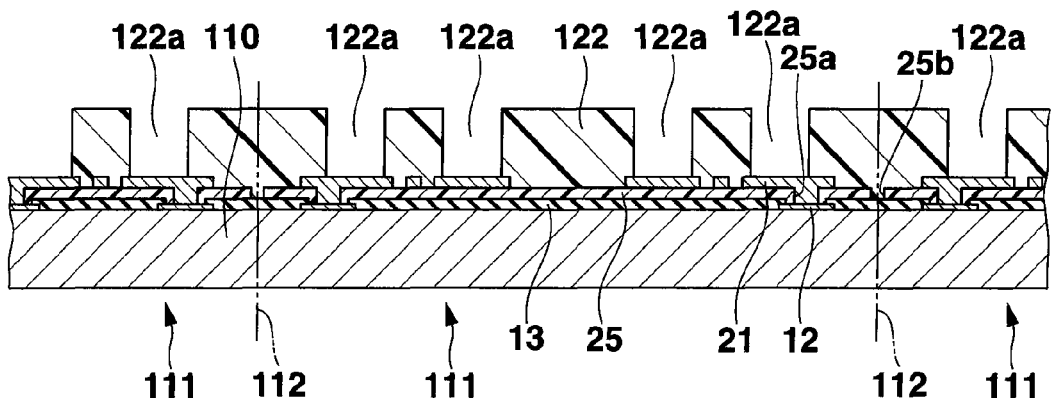

As shown in FIG. 2D, after the formation of the rewiring line 21, a dry film resist 122 thicker than the rewiring line 21 is affixed to one surface on the rewiring line 21 and the protective film 25. This dry film resist 122 is exposed and developed to form an opening 122a in the dry film resist 122. In the opening 122a, part of the rewiring line 21 is exposed. The position to form the opening 122a is the position of a columnar electrode 22 to be formed later. The dry film resist 122 is left in the position where the columnar electrode 22 to be formed later is not formed.

Then, the electrolytic plating method is carried out using the rewiring line 21 as an electrode so that the dry film resist 122 is used as a mask to cover part of the rewiring line 21 with the dry film resist 122.

Figure 3A:
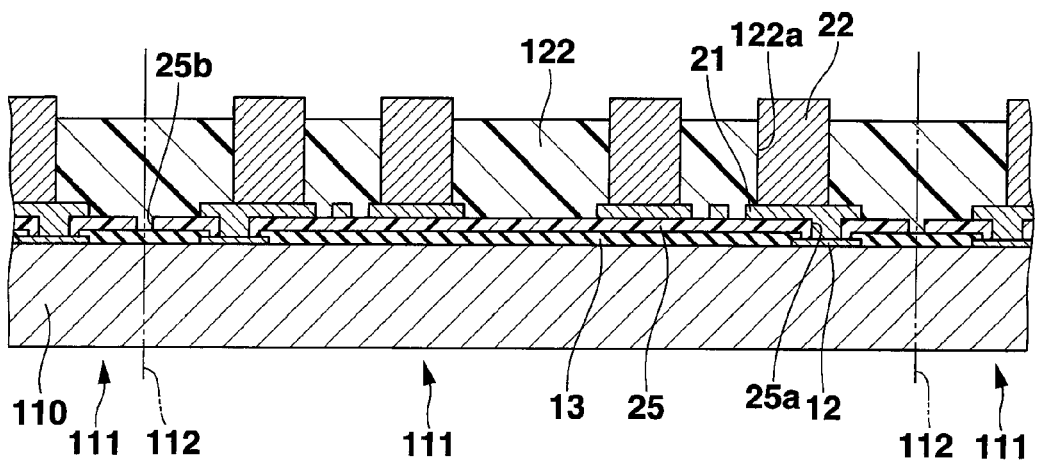
FIGS. 3A, 3B, and 3C are process charts following steps in FIG. 2.

In this way, as shown in FIG. 3A, the columnar electrode 22 is grown on the rewiring line 21 within the opening 122a. Here, the columnar electrode 22 is grown to be thicker than the rewiring line 21.

Figure 3B:
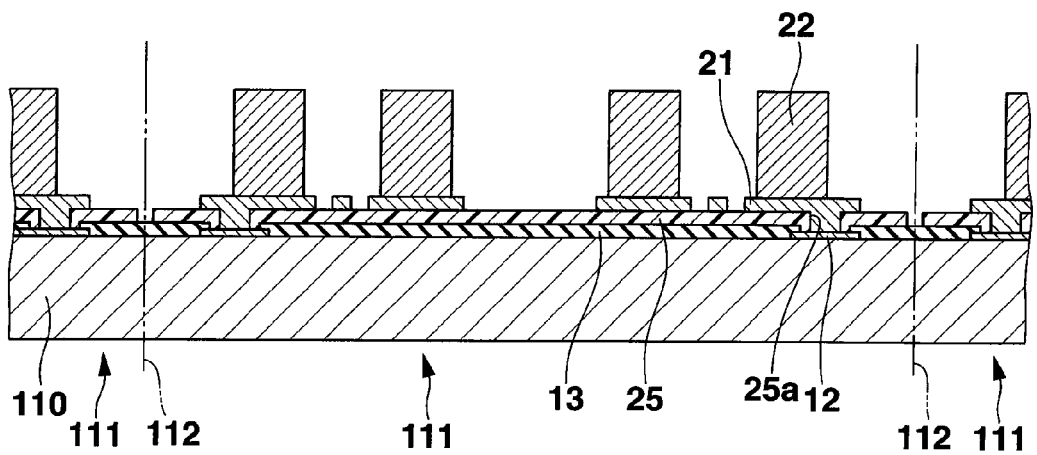

Then, as shown in FIG. 3B, the dry film resist 122 is removed after the formation of the columnar electrode 22.

Here, before the dry film resist 122 is affixed as described above or after the dry film resist 122 is removed as described above, part of the foundation metal layer of the rewiring line 21 that does not overlap the patterned rewiring line 21 is removed by etching. At the same time, the upper layer of the rewiring line 21 and the surface of the columnar electrode 22 are partly etched. However, the rewiring line 21 and the columnar electrode 22 are sufficiently thicker than the foundation metal layer, so that the rewiring line 21 and the columnar electrode 22 remain.

Figure 3C:
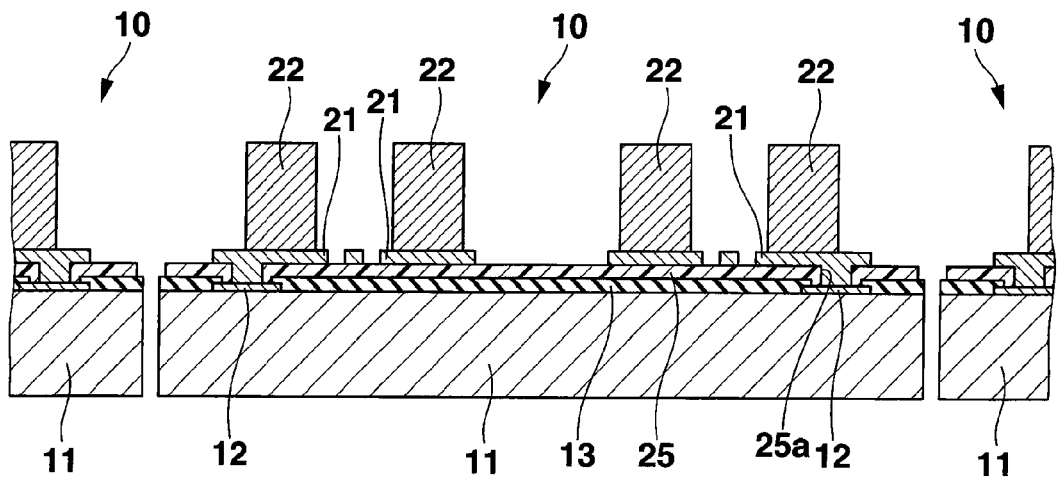

Then, as shown in FIG. 3C, the semiconductor wafer 110 is diced along the dicing streets 112, and the semiconductor wafer 110 is divided into a plurality of semiconductor chips 11. As a result, a semiconductor construct 10 provided with a plurality of columnar electrodes 22 erected on the surface of the semiconductor chip 11 is completed.

Now, the process for packaging the manufactured semiconductor construct 10 is described.

As shown in FIG. 4A, a mother base plate 131 is prepared. An adhesive layer 30 is applied or affixed and thereby formed in a region on one surface of the mother base plate 131 where the semiconductor chip 11 is installed. Further, a plurality of semiconductor chips 11 are arranged on the mother base plate 131 in matrix form, and the semiconductor chips 11 are bonded to the mother base plate 131 by the adhesive layer 30. In this way, the semiconductor chips 11 are installed on the mother base plate 131 in matrix form. When the semiconductor chips 11 are bonded to the mother base plate 131, the surface opposite to the surface in which the columnar electrode 22 is formed is bonded to the mother base plate 131. Here, the mother base plate 131 is the base plate 31 shown in FIG. 1 before cut.

Then, as shown in FIG. 4B, a single layer sheet-like prepreg 132 is stacked on the mother base plate 131 from above the semiconductor chips 11 and the columnar electrodes 22, and the prepreg 132 is pressurized and heated. Here, the prepreg 132 is pressurized toward the mother base plate 131. Thereby, part of the prepreg 132 is stacked on the semiconductor chip 11, and the semiconductor chips 11 are embedded in the prepreg 132. Further, the columnar electrode 22 is put through the prepreg 132. The prepreg 132 is heated and thereby cured into a sealing layer 32.

When a sealing layer 32 made of a fiber reinforced resin is to be formed, the prepreg 132 is a fiber reinforced prepreg. On the other hand, when a sealing layer 32 made of a resin which is not fiber reinforced is to be formed, the prepreg 132 is a prepreg which is not fiber reinforced. The fiber reinforced prepreg is formed by impregnating a fiber (e.g., glass fiber, glass fabric, carbon fiber, carbon fabric) with a thermosetting resin (e.g., epoxy resin, polyimide resin) and semi-curing the resin into a sheet form. As the prepreg which is not fiber reinforced, a thermosetting resin (e.g., epoxy resin, polyimide resin) which is semi-cured into a sheet form without impregnation of a fiber is used. As the fiber reinforced prepreg, it is particularly preferable to use a semi-cured glass fiber reinforced epoxy resin or glass fiber reinforced polyimide resin. As the prepreg which is not fiber reinforced, it is particularly preferable to use a semi-cured glass epoxy resin or polyimide resin which is not fiber reinforced.

Then, as shown in FIG. 5A, the surface of the sealing layer 32 and the top face of the columnar electrode 22 are ground.

The surface of the sealing layer 32 and the top face of the columnar electrode 22 are planarized by grinding. The top face of the columnar electrode 22 which is not exposed from the surface of the sealing layer 32 before grinding is exposed by grinding.

Then, as shown in FIG. 5B, a conductive layer 133 is grown on the surface of the sealing layer 32 and the top face of the columnar electrode 22 by an electroless plating method, electrolytic plating method or vapor-phase growth method (e.g., a sputter method) or by a combination of these methods. At the same time, a conductive film 36 also grows on the opposite surface.

Figure 6A:
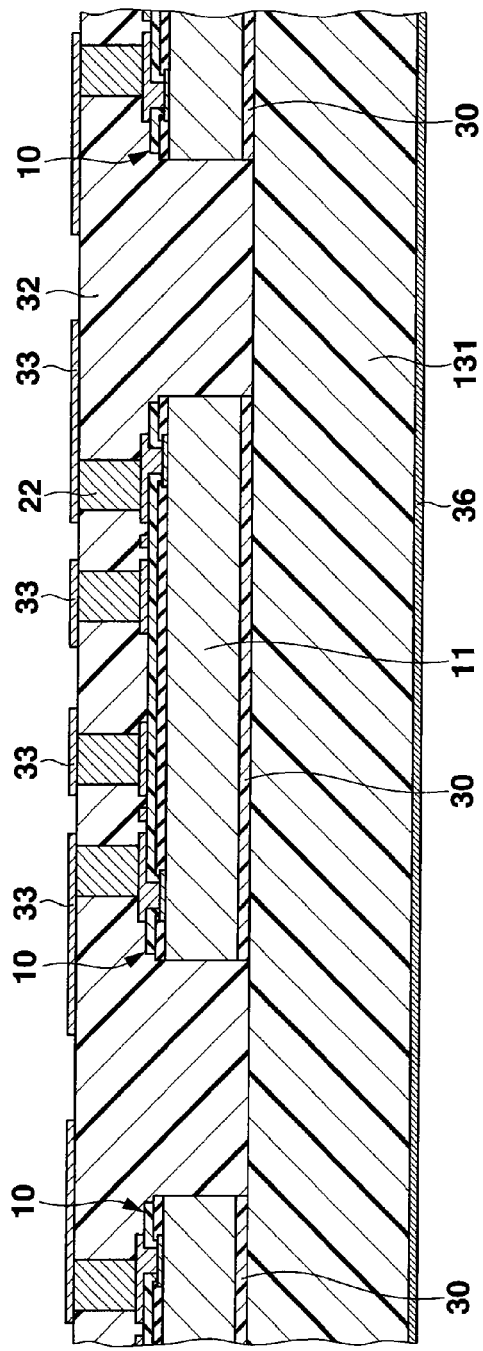
FIGS. 6A, and 6B are process charts following steps in FIG. 5.

Then, a resist (a dry film resist or liquid resist will also do) is applied to the conductive layer 133. The resist is exposed and developed. The remaining resist is used as a mask to etch the conductive layer 133. Thereby, the conductive layer 133 is formed/processed into an upper wiring line 33, as shown in FIG. 6A. After the upper wiring line 33 is patterned, the resist is removed.

Figure 6B:
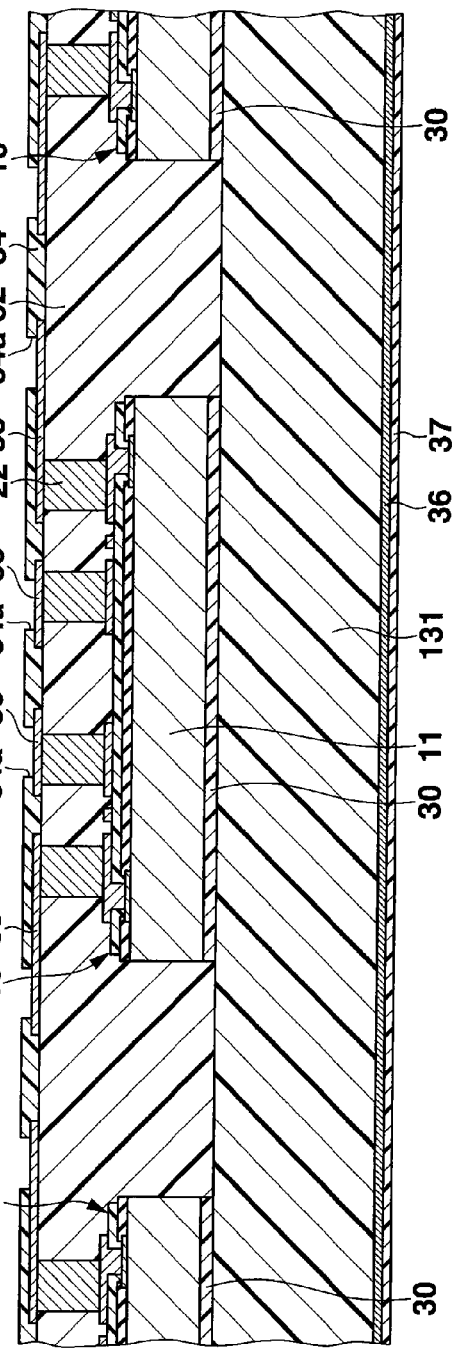

Then, as shown in FIG. 6B, the overcoat film 34 is patterned, so that the upper wiring line 33 and the sealing layer 32 are covered with the overcoat film 34, and part of the upper wiring line 33 is exposed through an opening 34a of the overcoat film 34. When the overcoat film 34 is formed, an overcoat layer 37 is also formed on the opposite surface.

After the step shown in FIG. 6A and before the step shown in FIG. 6B, insulating layers and rewiring lines may be alternately formed to produce multilayer wiring lines. Moreover, after the step shown in FIG. 6A and before the step shown in FIG. 6B, a through-hole may be formed from the surface of the sealing layer 32 to the opposite surface of the mother base plate 131.

Then, as shown in FIG. 7A, a solder ball 35 is formed on the upper wiring line 33 within each opening 34a. The formation of the solder ball 35 may be omitted, or the solder ball 35 may be formed after dicing processing described later.

Then, the mother base plate 131 and the sealing layer 32 are diced into a lattice shape for each semiconductor chip 11, and divided to form a plurality of semiconductor devices 1. Thus, as shown in FIG. 7B, the mother base plate 131 is divided by dicing into the base plates 31 for the respective semiconductor devices 1, and the sealing layer 32 is also divided. In consequence, the semiconductor device 1 is completed.

When a plurality of semiconductor chips 11 are included in one semiconductor device 1, the mother base plate 131 and the sealing layer 32 are not diced for each semiconductor chip 11 but are diced for each combination of semiconductor chips 11.

As described above, according to the embodiment, the prepreg 132 is used (see FIG. 4B) when the sealing layer 32 is formed. Thus, the columnar electrode 22 formed on the semiconductor chip 11 in advance can be put through the prepreg 132. That is, the prepreg 132 is stacked, heated and pressurized, and then ground to form the sealing layer 32. Therefore, the step of forming the sealing layer 32 serves both as a step of forming an insulating layer (sealing layer) that covers the upper surface of the semiconductor chip 11 and a step of forming an insulating layer (sealing layer) that covers the circumferential side surface of the semiconductor construct 10 including the semiconductor chip 11. Thus, in the method of manufacturing the semiconductor device 1, the steps of forming the insulating layers (sealing layers) can be reduced.

Furthermore, conventionally, in the EWLP method shown in Patent document 1, the upper surface of a sealing film (13) of a semiconductor construct (2) and the upper surface of an insulating layer (14) can be flat as far as the process is concerned. However, steps are produced due to, for example, curing, contraction or thermal expansion, and wiring lines may be broken. Therefore, after the upper insulating layer (15) is formed on the semiconductor construct (2) and the upper surface of the insulating layer (14), the via (16) is formed by laser, and then the upper wiring line (18) is formed on the upper insulating layer (15).

According to the embodiment, the upper wiring line 33 can be directly formed on the sealing layer 32. Therefore, there is no need for a step of forming a via in the sealing layer 32 by laser after the sealing layer 32 is formed and forming an electrode in the laser via. This makes it possible to reduce the steps, time and costs required for the manufacture of the semiconductor device 1. Moreover, it is not necessary to form an upper insulating film, so that the semiconductor device 1 can be smaller in thickness.

Furthermore, as the prepreg 132 is semi-cured, the thick sealing layer 32 can be formed around the columnar electrode 22 even if the columnar electrode 22 is high.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

mounting a plurality of semiconductor constructs on a base plate, each of the semiconductor constructs including a semiconductor substrate, an LSI formed on a surface of the semiconductor substrate, connection pads which are connected to the LSI provided on the semiconductor substrate, an insulating film formed on the semiconductor substrate and having openings in regions corresponding to the connection pads, a wiring line provided directly on the insulating film so as to connect to one of the connection pads via one of the openings of the insulating film, and a columnar electrode formed on a land of the wiring line and protruding from the surface of the semiconductor substrate;

stacking a sealing layer on the semiconductor constructs except for top surfaces of the columnar electrodes and on the base plate, such that the sealing layer contacts side surfaces of the wiring lines and side surfaces of the semiconductor substrates;

forming upper wiring lines on an upper surface of the sealing layer and the top surfaces of the columnar electrodes; and dicing the sealing layer after the forming of the upper wiring lines to obtain a plurality of semiconductor devices each having at least one semiconductor construct, such that the wiring line of the at least one semiconductor construct is covered by the sealing layer except for the land where the columnar electrode is formed, and at least a part of one of the upper wiring lines is formed on the sealing layer in a region outside the semiconductor construct, wherein the insulating film has one or more layers and comprises at least one passivation film;

wherein the prepreg is a sheetlike semi-cured resin; and wherein stacking the sealing layer comprises laying a prepreg on the semiconductor constructs and the base plate and heating and pressurizing the prepreg towards the base plate to form the sealing layer, such that the semiconductor constructs are embedded in the sealing layer and each of the columnar electrodes penetrates through the sealing layer, whereby the top surfaces of the columnar electrodes are exposed from the upper surface of the sealing layer.

2. The method according to claim 1, wherein forming the upper wiring lines includes growing a conductive layer directly on the upper surface of the sealing layer and the top surfaces of the columnar electrodes.

3. The method according to claim 1, wherein the prepreg is a single layer which is not fiber reinforced.

4. The method according to claim 1, wherein the sealing layer has light blocking properties.

5. The method according to claim 1, further comprising forming a through-hole from the upper surface of the sealing layer to a surface of the base plate opposite to the upper surface of the sealing layer, and dicing the base plate when dicing the sealing layer.

6. The method according to claim 1, wherein forming the upper wiring lines on the sealing layer includes connecting the upper wiring lines directly to the columnar electrodes without any insulating film therebetween.

7. The method according to claim 1, further comprising forming solder balls on the upper wiring lines.

8. The method according to claim 1, wherein the upper surface of the sealing layer and the top surfaces of the columnar electrodes are in a same plane.

9. The method according to claim 1, wherein stacking the sealing layer further comprises exposing the top surface of the columnar electrode from the upper surfaces of the sealing layer by grinding.

10. The method according to claim 1, wherein stacking the sealing layer further includes grinding the top surfaces of the columnar electrodes and the upper surface of the sealing layer to be in a same plane.

11. A semiconductor device manufacturing method comprising:
mounting a plurality of semiconductor constructs on a base plate, each of the semiconductor constructs including a semiconductor substrate, an LSI formed on a surface of the semiconductor substrate, connection pads connected to the LSI provided on the semiconductor substrate, an insulating film formed on the semiconductor substrate and having openings in regions corresponding to the connection pads, a wiring line provided directly on the insulating film so as to connect to one of the connection pads via one of the openings of the insulating film, and a columnar electrode formed on a land of the wiring line and protruding from the surface of the semiconductor substrate;
stacking a sealing layer on the semiconductor constructs except for top surfaces of the columnar electrodes and on the base plate, such that the sealing layer contacts side surfaces of the wiring lines and side surfaces of the semiconductor substrates;
forming upper wiring lines on an upper surface of the sealing layer and the top surfaces of the columnar electrodes; and
dicing the sealing layer after the forming of the upper wiring lines to obtain a plurality of semiconductor devices each having at least one semiconductor construct, such that the wiring line of the at least one semiconductor construct is covered by the sealing layer except for the land where the columnar electrode is formed, and at least a part of one of the upper wiring lines is formed on the sealing layer in a region outside the semiconductor construct,
wherein the insulating film has two or more films and comprises a passivation film and a protection film formed on the passivation film;
wherein the prepreg is a sheetlike semi-cured resin; and
wherein stacking the sealing layer comprises laying a prepreg on the semiconductor constructs and the base plate and heating and pressurizing the prepreg towards the base plate to form the sealing layer, such that the semiconductor constructs are embedded in the sealing layer and each of the columnar electrodes penetrates through the sealing layer.

12. The method according to claim 11, further comprising forming a through-hole from the upper surface of the sealing layer to a surface of the base plate opposite to the upper surface of the sealing layer.

13. The method according to claim 11, wherein each of the semiconductor devices has a combination of chips.

14. A semiconductor device manufacturing method comprising:
mounting a plurality of semiconductor constructs on a base plate, each of the semiconductor constructs including a semiconductor substrate, an LSI formed on a surface of the semiconductor substrate, connection pads connected to the LSI provided on the semiconductor substrate, an insulating film formed on the semiconductor substrate and having openings in regions corresponding to the connection pads, and a columnar electrode provided to protrude from the surface of the semiconductor substrate;
stacking a sealing layer on the semiconductor constructs except for top surfaces of the columnar electrodes and on the base plate, such that the sealing layer contacts side surfaces of the semiconductor substrates;
forming upper wiring lines directly on an upper surface of the sealing layer and the top surfaces of the columnar electrodes; and
dicing the sealing layer after the forming of the upper wiring lines to obtain a plurality of semiconductor devices each having at least one semiconductor construct, such that at least a part of one of the upper wiring lines is formed on the sealing layer in a region outside the semiconductor construct,
wherein the insulating film has one or more layers and comprises at least a passivation film;
wherein the prepreg is a sheetlike semi-cured resin; and
wherein stacking the sealing layer comprises laying a prepreg on the semiconductor constructs and the base plate and heating and pressurizing the prepreg toward the base plate to form the sealing layer, such that the semiconductor constructs are embedded in the sealing layer and each of the columnar electrodes penetrates through the sealing layer, whereby the top surfaces of the columnar electrodes are exposed from the upper surface of the sealing layer.

15. The method according to claim 14 wherein the forming upper wiring lines comprises growing a conductive layer directly on the upper surface of the sealing layer and the top surface of the columnar electrode.

16. The method according to claim 14, further comprising forming a through-hole from the upper surface of the sealing layer to a surface of the base plate opposite to the upper surface of the sealing layer, and dicing the base plate when dicing the sealing layer.

17. The method according to claim 14 wherein each of the semiconductor devices has a combination of chips.

18. The method according to claim 14, wherein the upper surface of the sealing layer and the top surfaces of the columnar electrodes are in a same plane.

19. The method according to claim 14, wherein stacking the sealing layer further comprises exposing the top surface of the columnar electrode from of the upper surfaces of the sealing layer by grinding.

20. The method according to claim 14, wherein stacking the sealing layer further includes grinding the top surfaces of the columnar electrodes and the upper surface of the sealing layer to be in a same plane.

* * * * *